United States Patent
Lee et al.

(10) Patent No.: US 9,064,553 B2
(45) Date of Patent: Jun. 23, 2015

(54) FAST MEMORY READ-OUT

(71) Applicant: ORACLE INTERNATIONAL CORPORATION, Redwood City, CA (US)

(72) Inventors: Jungyong Lee, San Jose, CA (US); Heechoul Park, San Jose, CA (US); Singrong Li, San Jose, CA (US)

(73) Assignee: ORACLE INTERNATIONAL CORPORATION, Redwood City, CA (US)

( * ) Notice: Subject to any disclaimer, the term of this patent is extended or adjusted under 35 U.S.C. 154(b) by 131 days.

(21) Appl. No.: 13/685,204

(22) Filed: Nov. 26, 2012

(65) Prior Publication Data

US 2014/0146622 A1 May 29, 2014

(51) Int. Cl.
*G11C 7/00* (2006.01)
*G11C 7/10* (2006.01)
*G11C 7/20* (2006.01)

(52) U.S. Cl.
CPC .......... *G11C 7/1048* (2013.01); *G11C 7/1069* (2013.01); *G11C 7/20* (2013.01)

(58) Field of Classification Search
CPC ......... G11C 7/1051; G11C 16/26; G11C 7/22
USPC ...................................... 365/189.15
See application file for complete search history.

(56) References Cited

U.S. PATENT DOCUMENTS 7,554,864 B2 * 6/2009 Park ............................ 365/193

\* cited by examiner

*Primary Examiner* — Hoai V Ho
*Assistant Examiner* — Tri Hoang
(74) *Attorney, Agent, or Firm* — Marsh Fischmann & Breyfogle LLP; Daniel J. Sherwinter

(57) ABSTRACT

Embodiments include systems and methods for faster memory read-out using a combined read-select circuit. A novel read-select circuit is described, which, when enabled for reading, concurrently reads its respective input line and selects its value for read-out by the circuit. This can reduce delays and unnecessary toggling resulting from separate read and select circuits. Some implementations also include a multi-global-line architecture that can reduce the number of read stages in the memory read-out circuitry, thereby further reducing read-out delays. Accordingly, embodiments can be faster and more efficient than many traditional implementations without relying on an increase in power consumption or clock speed.

22 Claims, 9 Drawing Sheets

FAST MEMORY READ-OUT

FIELD

Embodiments relate generally to memory circuitry, and, more particularly, to read-out circuitry for wide column selection memory arrays.

BACKGROUND

Functionality of computational systems often involves access to values stored in one or more specific cells of large memory arrays. The memory array includes rows and columns of memory cells. Typically, addressing circuitry and/or signals are used to select a memory cell from the array that is associated with a specified row and column, and the value of that memory cell is passed through read-out circuitry to a shared output line. In this way, specific values can be selected from large arrays of memory cells with an appreciably reduced number of read-out lines. However, adding circuitry to the memory read-out path can negatively impact power consumption and memory access times. While addressing and read-out circuitry can be sped up by increasing clock speeds, realizing the additional clock speeds can involve consuming additional power. Accordingly, it may be desirable in many applications to provide novel techniques for speeding up the read-out of memory arrays without relying on increased power consumption.

BRIEF SUMMARY

Among other things, embodiments provide novel systems and methods for memory read-out using a combined read-select circuit. A novel read-select circuit is described, which, when enabled for reading, concurrently reads its respective input line and selects its value for read-out by the circuit. For example, the read-select circuit includes a pull-up network and a pull-down network, operable to pull up or pull down a read-out line according to both a read input value and a select input value. When the select value is enabled, the circuit effectively reads and selects the value within a single gate delay time. This can reduce delays and unnecessary toggling resulting from separate read and select circuits. Some implementations also include a multi-global-line architecture that can reduce the number of read stages in the memory read-out circuitry, thereby further reducing read-out delays. Accordingly, embodiments can be faster and more efficient than many traditional implementations without relying on an increase in power consumption or clock speed.

According to one set of embodiments, a system is provided for memory read-out. The system includes a read-select circuit that has: a read input; a select input; a first and a second voltage level input; a read-select output; a first switch network; and a second switch network. The first switch network is coupled between the read-select output and the first voltage level input, the first switch network having a first switch coupled with the read input and a second switch coupled with the select input, the first switch network operable to pull the read-select output to the first voltage level input when the read input is in a first read state and the select input is in a select state. The second switch network is coupled between the read-select output and the second voltage level input, the second switch network having a third switch coupled with the read input and a fourth switch coupled with the select input, the second switch network operable to pull the read-select output to the second voltage level input when the read input is in a second read state and the select input is in the select state.

According to another set of embodiments, a method is provided for memory read-out. The method includes: coupling a read input to a first switch of a first switch network and to a first switch of a second switch network, the first switch network coupled between a read-select output and a first voltage level, and the second switch network coupled between the read-select output and a second voltage level; coupling a select input to a second switch of the first switch network and to a second switch of the second switch network, the first and second switches of the first switch network configured to pull the read-select output to the first voltage level when the select input is in a select state and the read input is in a first read state, and the first and second switches of the second switch network configured to pull the read-select output to the second voltage level when the select input is in the select state and the read input is in a second read state; and switching the select input to the select state when the read input is in the first read state, thereby pulling the read-select output to the first voltage level.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a second label that distinguishes among the similar components. If only the first reference label is used in the specification, the description is applicable to any one of the similar components having the same first reference label irrespective of the second reference label.

DETAILED DESCRIPTION

Functionality of computational systems often involves access to values stored in one or more specific cells of large memory arrays, and fast access speeds are typically desirable. Traditional addressing and read-out circuitry coupled with wide memory arrays can increase memory access times. While addressing and read-out circuitry can be sped up by increasing clock speeds, realizing the additional clock speeds can involve consuming additional power. Accordingly, it may be desirable in many applications to provide novel techniques for speeding up the read-out of memory arrays without relying on increased power consumption.

As described below, many traditional memory read-out techniques involve separate read and select circuits on each line (e.g., associated with each column of a connected memory array), and additional global read and select circuits for selecting between multiple sub-arrays (e.g., a right-side memory sub-array and a left-side memory sub-array that make up a wide memory array). The multiple separate read and select circuits can manifest a number of limitations. For example, each circuit can contribute delay to the memory read-out functionality, separate read and select circuitry can cause unnecessary toggling of unselected portions of the circuit, many implementations rely on additional recovery circuitry, etc.

Embodiments described herein include a novel read-select circuit that, when enabled for reading, concurrently reads its respective input line and selects its value for read-out by the circuit. This can reduce delays and unnecessary toggling resulting from separate read and select circuits. Some implementations also include a multi-global-line architecture that can reduce the number of read stages in the memory read-out circuitry, thereby further reducing read-out delays. Accordingly, embodiments can be faster and more efficient than many traditional implementations without relying on an increase in power consumption or clock speed.

In the following description, numerous specific details are set forth to provide a thorough understanding of the present invention. However, one having ordinary skill in the art should recognize that the invention may be practiced without these specific details. In some instances, circuits, structures, and techniques have not been shown in detail to avoid obscuring the present invention.

Figure 1A:
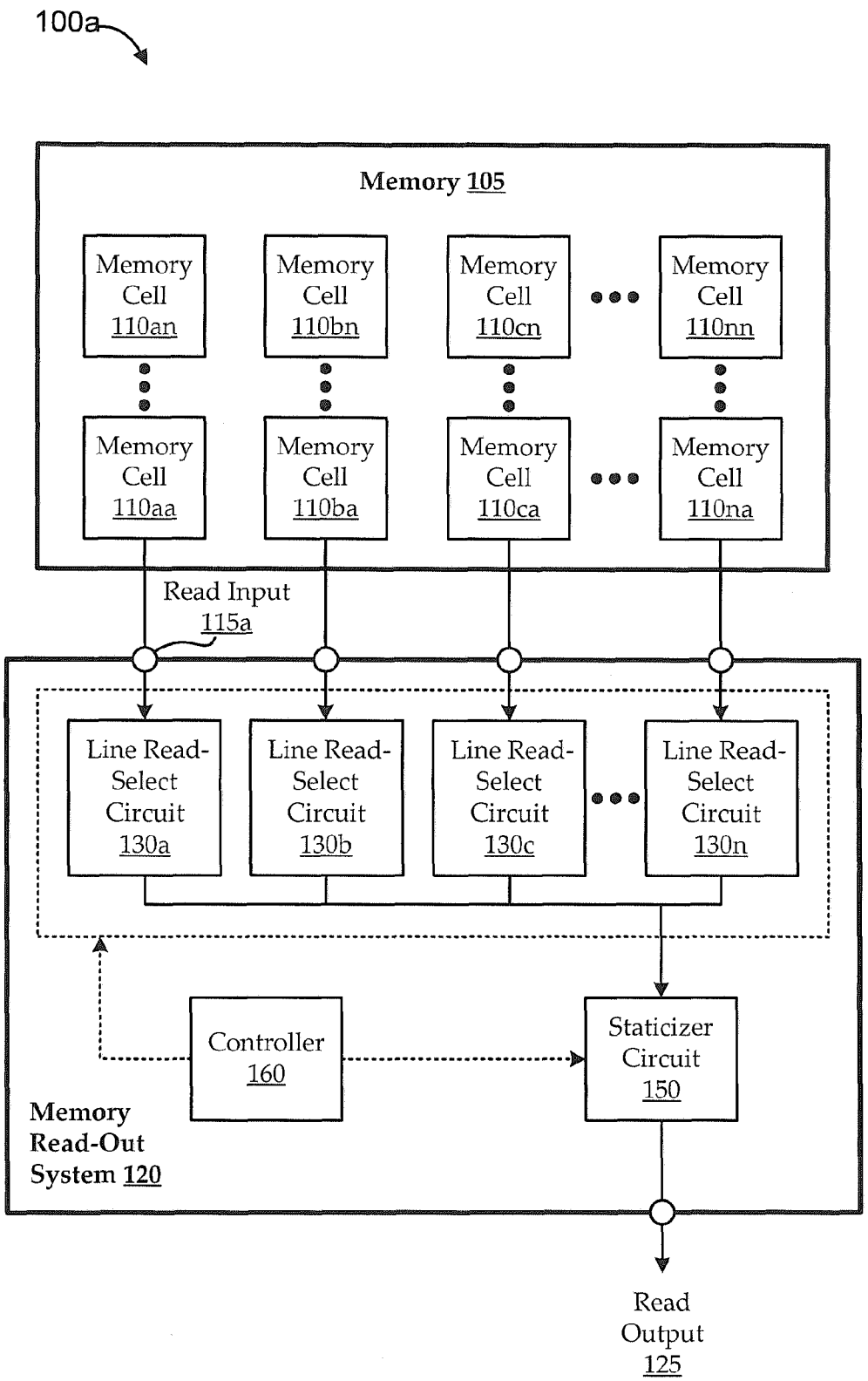
FIG. 1A shows a block diagram of an illustrative memory read-out environment, according to various embodiments.

Turning first to FIG. 1A, a block diagram is shown of an illustrative memory read-out environment 100a, according to various embodiments. The memory read-out environment 100a includes a memory array 105 coupled with a memory read-out system 120. The memory array 105 includes a number of memory cells 110 arranged in an array of rows and columns. Addressing circuitry (not shown) is used to select one of the memory cells 110 to be read out by the memory read-out system 120. As illustrated, each column of the array of memory cells 110 is coupled in parallel to an input of the memory read-out system 120, and the memory read-out system 120 outputs a single read output line 125 representing the value of the selected memory cell 110. Embodiments are described herein according to a column selection and read-out scheme for a memory array, but similar or identical techniques can be applied for different memory architectures without departing from the scope of embodiments.

Embodiments of the memory read-out system 120 include line read-select circuits 130 (e.g., each coupled with a column of the array of memory cells 110) and a staticizer circuit 150. According to some implementations, functionality of the various circuits is controlled via signaling from a controller 160. Addressing circuitry (e.g., that is part of or separate from the controller 160) can be used to select a single memory cell 110 for read-out by its row and column. For example, a desired value is stored at the memory cell 110 in position (row a, column a) of the array (illustrated as memory cell 110aa). Addressing circuitry is used to select "row a," so that the value of the "column a" line corresponds to memory cell 110aa. Accordingly, the read input line 115a corresponding to "column a" and coupled with line read-select circuit 130a corresponds to the value stored at memory cell 110aa.

Though each line read-select circuit 130 is coupled with a respective column via a respective read input line 115, only the value being read by line read-select circuit 130a is desired. The controller 160 (e.g., which can include the same or different addressing circuitry) can effectively enable one of the line read-select circuits 130, which concurrently reads the value of its respective read input line 115 and selects its read value as the value to be passed to the read output line 125 via the staticizer circuit 150. The staticizer circuit 150 can include any circuitry for presenting the selected line read-select circuit 130 output as the read output line 125 in a manner suitable for use by other components. For example, the staticizer circuit 150 includes circuitry to facilitate global reset functionality, isolation functionality (e.g., with proper output impedance), gating functionality, etc. Some embodiments of the memory read-out environment 100a include additional circuitry for providing read locking, recovery, reset, and/or other functionality.

Figure 1B:
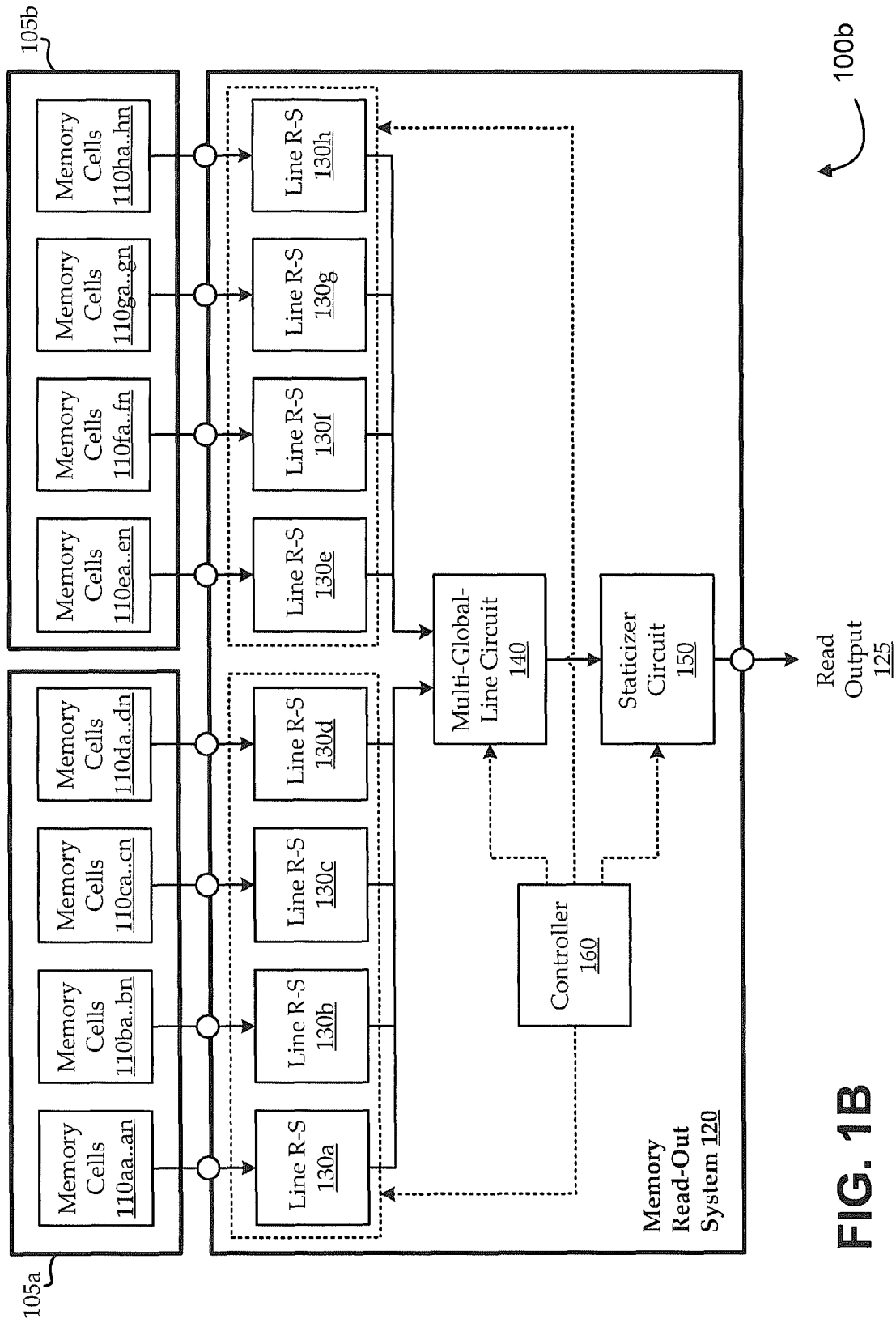
FIG. 1B shows a block diagram of another illustrative memory read-out environment, according to various embodiments.

FIG. 1B shows a block diagram of another illustrative memory read-out environment 100b, according to various embodiments. The memory read-out environment 100b includes a memory array 105 (illustrated as including a left-hand memory sub-array 105a and a right-hand memory sub-array 105b) coupled with a memory read-out system 120. The memory array 105 includes a number of memory cells 110 arranged in an array of rows and columns. As in FIG. 1A, each column of memory cells 110 in the memory array 105 is coupled with a respective line read-select circuit 130 via a read input line 115 of the memory read-out system 120.

In the illustrated architecture, the line read-select circuits 130 are arranged in subsets, each subset corresponding to one of the sub-arrays of the memory array 105. According to many traditional implementations, separate read and select circuitry is used, first at the subset level, and then at a global level. For example, all the read circuits in a subset independently toggle according to the values of their respective connected memory cells, and a first selection circuit selects which value from the subset is of interest (i.e., a first read stage). Then, values from the various subsets (each subset passes a value, even if not of interest) are passed to a global read circuit and a global select circuit that read then select the value of interest from among the subsets (i.e., a second read stage). The value of interest can be passed on a single global read line for use as the final read output value (i.e., a third read stage). As illustrated in FIG. 1B, the subsets of line read-select circuits 130 can be passed to a multi-global-line circuit 140. Embodiments of the multi-global-line circuit 140 allow the concurrently read and selected value from each subset to be passed through to the staticizer circuit 150 (e.g., in parallel) without an intermediate global read stage. As described with reference to FIG. 1A, functionality of the line read-select circuits 130, the staticizer circuit 150, and the multi-global-line circuit 140 can be controlled by the controller 160. Further, though not shown, embodiments further include additional circuitry for providing read locking, recovery, reset, and/or other functionality, for example, as described below.

Figure 2B:
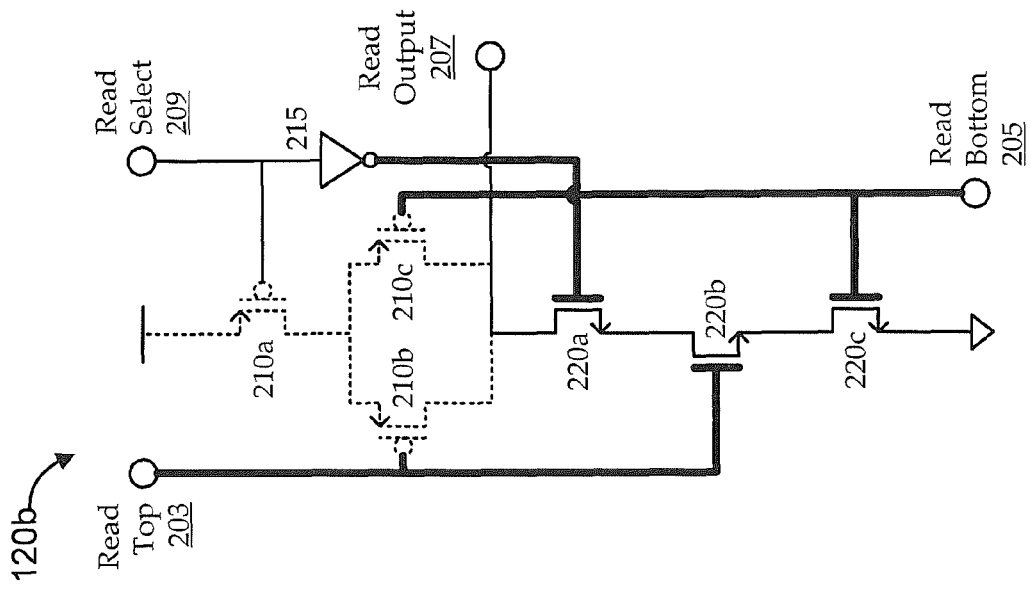
FIGS. 2A and 2B show schematic diagrams of an illustrative line read-select circuit when reading a HIGH and a LOW memory value, respectively, according to various embodiments.
Figure 2A:
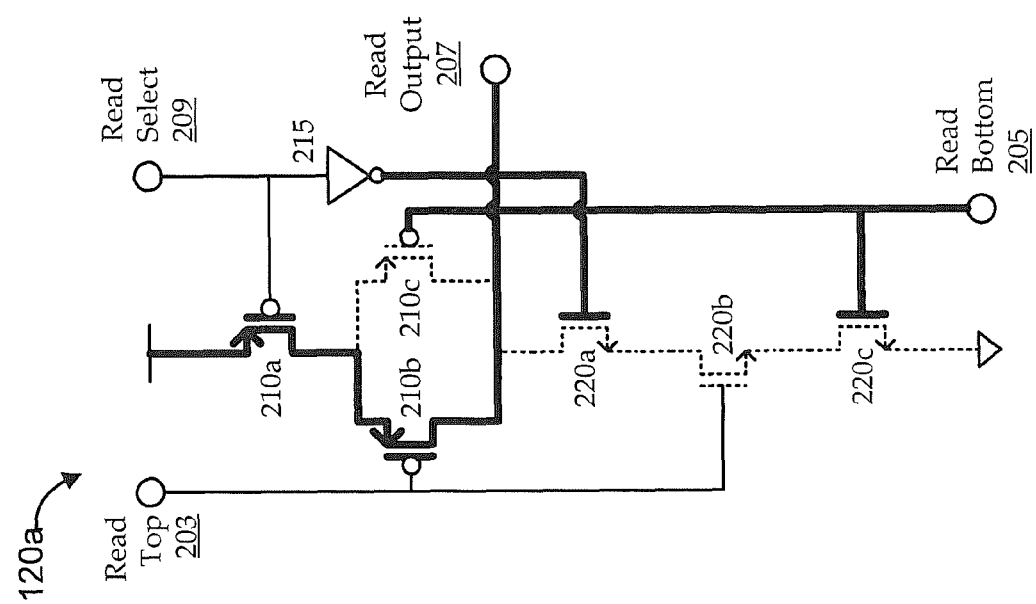

FIGS. 2A and 2B show schematic diagrams of an illustrative line read-select circuit 130 when reading a HIGH and a LOW memory value, respectively, according to various embodiments. The value of interest (e.g., the read input line corresponding to a column of memory cells) is coupled to a read_top input 203. Some implementations support additional read inputs. For the sake of simplicity, another read input (a read_bottom input 205) is shown, but it assumed to be held LOW. It will be appreciated that the circuit can be easily modified to remove the read_bottom input 205 (e.g., by also removing components 210c and 220c), or configured to read the read_bottom input 205 path by holding the read_top input 203 LOW.

In the illustrated circuit, a read_select input 209 is provided in such a way that the line read-select circuits 130 are enabled (i.e., concurrently read and selected) when the read_select input 209 is LOW. Accordingly, it is assumed that the read_select input 209 is initially HIGH. The line read-select circuits 130 include a "pull-up" network of PMOS transistors 210 and a "pull-down" network of NMOS transistors 220 on either side of a read_output line 207. With the read_bottom input 205 held LOW, it effectively allows operation of the line read-select circuits 130 to be controlled completely by the read_top input 203 and the read_select input 209.

Turning first to FIG. 2A, the value of interest being read at the read_top input 203 is LOW. The LOW signal turns on PMOS transistor 210b and turns off NMOS transistor 220b. When the read_select input 209 is set to LOW (i.e., when the line read-select circuit 130a is enabled), the LOW signal turns on PMOS transistor 210a. Accordingly, the read_output line 307 is pulled HIGH through the pull-up network of PMOS transistors 210 (i.e., through PMOS transistor 210a and PMOS transistor 210b). The read_select input 209 is also passed through an inverter 215, thereby presenting a HIGH value to the NMOS transistor 220 network and turning on NMOS transistor 220a. However, because NMOS transistor 220b is in series with NMOS transistor 220a and is off, the pull-down network of NMOS transistors 220 does not affect the read_output line 307.

Turning to FIG. 2B, the value of interest being read at the read_top input 203 is HIGH. The HIGH signal turns off PMOS transistor 210b and turns on NMOS transistor 220b. As in FIG. 2A, when the read_select input 209 is set to LOW, the LOW signal turns on PMOS transistor 210a and (after passing through inverter 215) turns on NMOS transistor 220a. Accordingly, the read_output line 307 is pulled LOW through the pull-down network of NMOS transistors 210 (i.e., through NMOS transistor 220a and NMOS transistor 220b (and through NMOS transistor 220c in embodiments that include the read_bottom input 205)). Even though the read_select input 209 turns on PMOS transistor 210a, the read_top input 203 has turned off PMOS transistor 210a in series therewith, so that the pull-up network of PMOS transistors 210 does not affect the read_output line 307.

The line read-select circuits 130 shown in FIGS. 2A and 2B show an illustrative circuit configuration by which the read and select circuitry is effectively combined into a single gate with a single delay. Various modifications can be made to the circuit without departing from the scope of embodiments. For example, the circuit can be reconfigured and/or component selections can be affected to accommodate additional read inputs, to use different types of circuit components, to accommodate different design specifications (e.g., relating to power, impedance, switching frequency, cost, etc.), and/or for other reasons. For example, the circuit can be reconfigured to be enabled when the read_select input 209 is HIGH. The circuit can also be reconfigured so that the read_output line 307 is HIGH when the value being read on the read_top input 203 is HIGH.

As will be described more fully below, use of these types of line read-select circuits 130 provides various features. For example, embodiments can be configured so they do not toggle when they are not selected. Further, embodiments can be configured to operate in context of a multi-global-line architecture, without additional recovery signaling, and/or with other features.

Figure 3A:
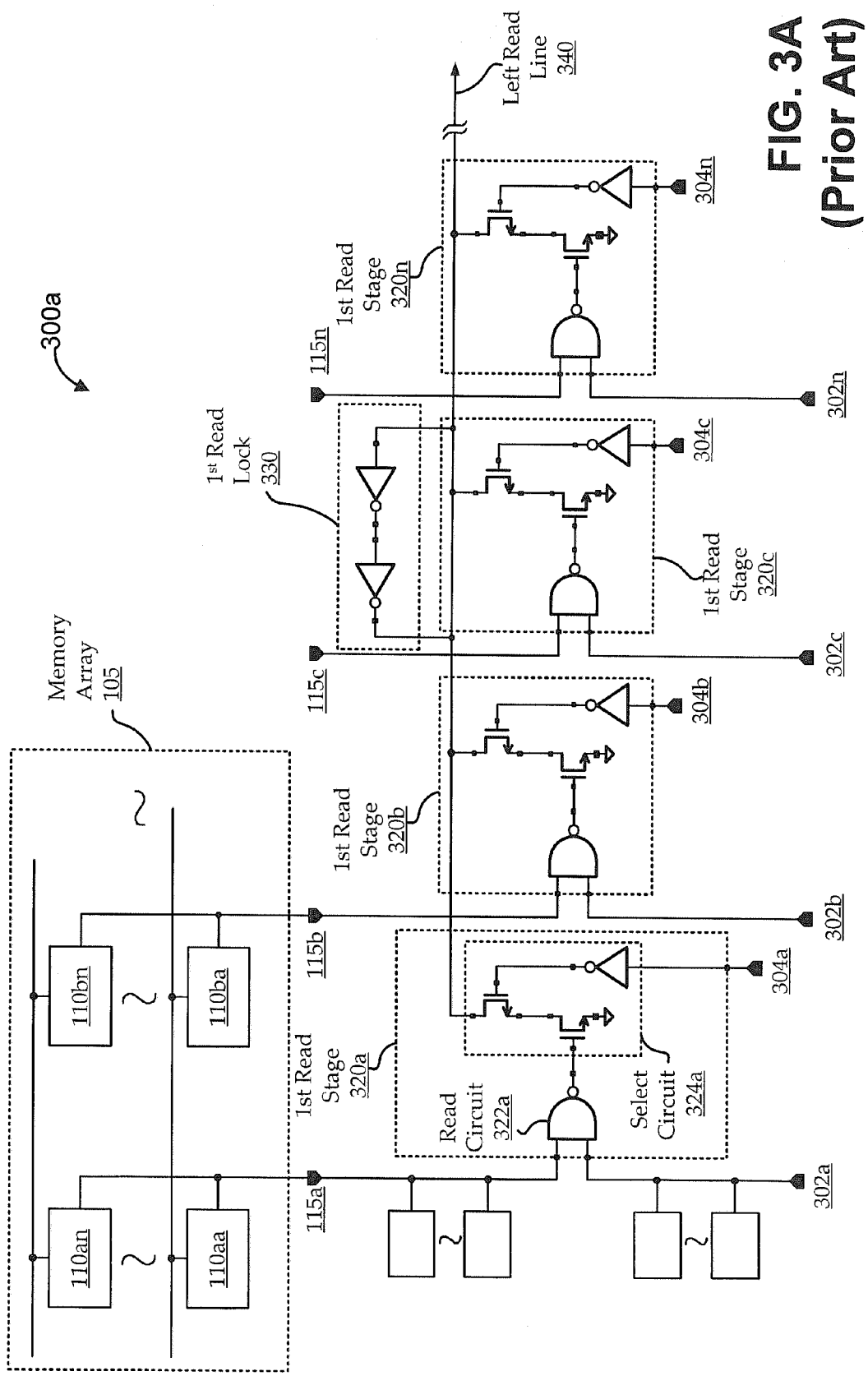
FIGS. 3A and 3B show schematic diagrams of a first and second part of a traditional memory read-out implementation, respectively.
Figure 3B:
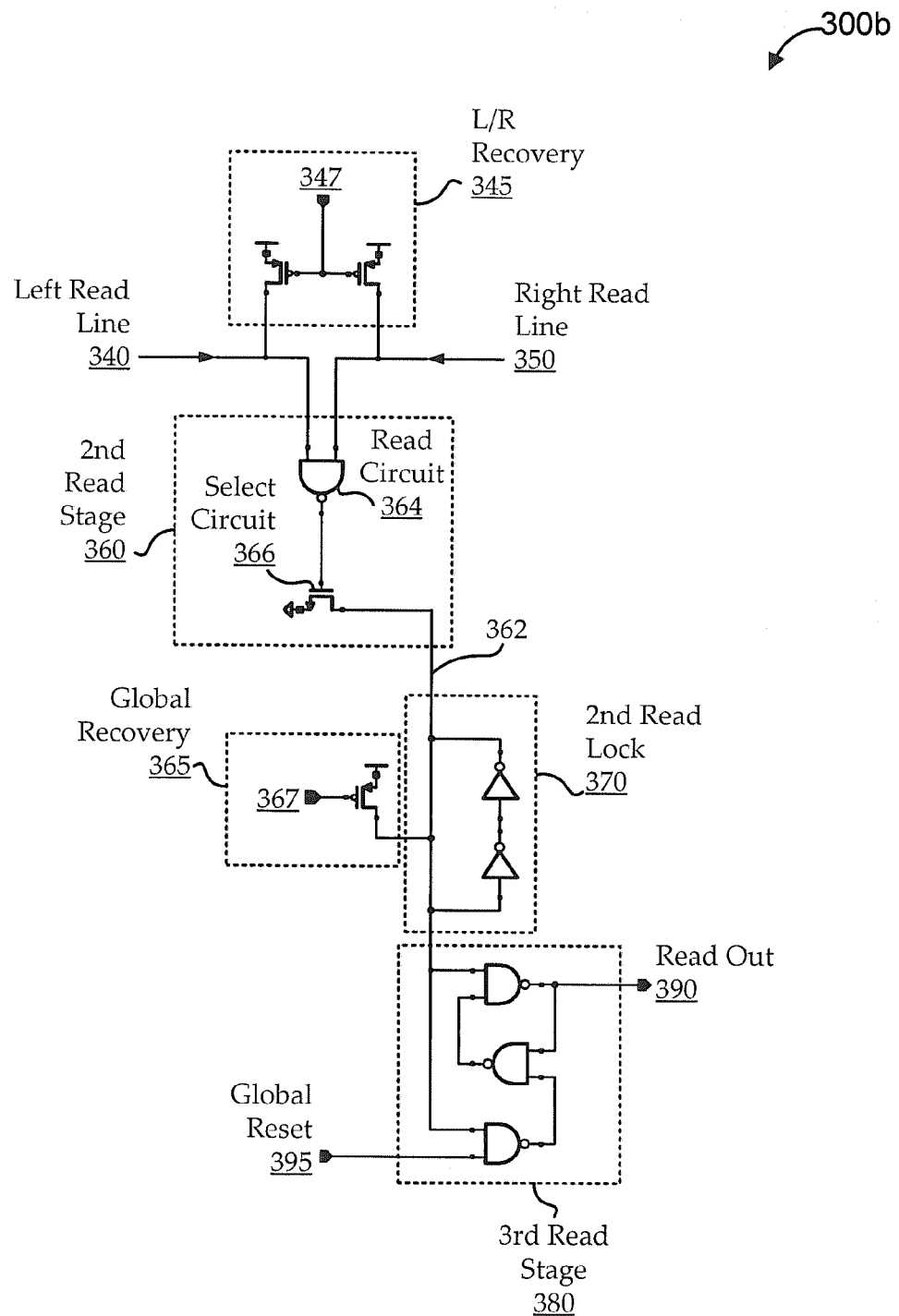

For the sake of added clarity, FIGS. 3A and 3B show schematic diagrams of a first and second part of a traditional memory read-out implementation 300, respectively. The illustrative traditional implementation is intended only to highlight novel features of some embodiments described herein, and is not intended to represent any particular prior art embodiment or to limit the scope of novel embodiments described herein. In FIG. 3A, a memory array 105 of memory cells 110 is coupled to a memory read-out circuit. For example, each column of the memory array 105 is coupled with a respective first read stage 320. It is assumed (e.g., as described above with reference to FIG. 1B) that the illustrated memory array 105 is actually a left-hand sub-array, and, though not shown for the sake of simplicity, a substantially identical right-hand sub-array is coupled with substantially identical first read stages 320.

As will be described below, each traditional first read stage 320 includes a separate read circuit 322 and select circuit 324, each introducing a respective delay. As the values stored in the memory cells 110 toggle, so do the coupled read circuits 322 of the first read stages 320. When a selection is made (e.g., using column addressing), the selected value is reflected on a left read line 340 (i.e., and substantially identical functionality causes a value to be reflected on a right read line 350, shown in FIG. 3B). A first read lock circuit 330 can be included, for example, to prevent the left read line 340 from floating.

Turning to FIG. 3B, the left read line 340 and right read line 350 are coupled with a second read stage 360 (e.g., a global read stage). The second read stage 360 also includes a global read circuit 364 and a global select circuit 366, each of which introduces delay. The selected value from the second read stage 360 is passed on a single global read line 362 to a third read stage 380, which outputs a read out line 390. The third read stage 380 typically includes a read circuit (e.g., a staticizer or the like), but no additional select circuit, thereby adding a single additional delay. Some implementations also include a second read lock circuit 370, for example, to maintain the selected value from the second read stage 360 while it is read out. Some implementations also include a left-right recovery circuit 345 and a global recovery circuit 365 to ensure that the selected memory cell value is actually the values being read out.

For the sake of illustration, the signals are initially configured so that all the line_bottom signals 302 are HIGH and all the line_select signals 304 are LOW. Between reads, a left-right recovery signal 347 can go LOW, causing the left-right recovery circuit 345 to pull both the left read line 340 and the right read line 350 HIGH. The left-right recovery signal 347 can return to HIGH, effectively turning the left-right recovery circuit 345 off, and allowing the values on the left read line 340 and the right read line 350 to be controlled by their respective first read stages 320 (e.g., and/or maintained by the respective first read lock circuits 330). Similarly, a global recovery signal 367 can go LOW, causing the global recovery circuit 365 to pull the global read line 362 HIGH. The global recovery signal 367 can return to HIGH, effectively turning the global recovery circuit 365 off, and allowing the value on the global read line 362 to be controlled by the second read stage 360 (e.g., and/or maintained by the second read lock circuit 370). A global reset signal 395 is also set to HIGH.

Suppose it is desired to read "column a" of memory cells (110aa-110an) coupled with first read stage 320a, and the value is LOW (e.g., logical 0). The value at the respective read input line 115a is LOW, causing the read circuit 322a to output a HIGH value, thereby turning on the bottom half of the select circuit 324a after a first delay. The line_select signal 304a is toggled to HIGH, thereby turning on the other half of the select circuit 324a, and pulling the left read line 340 LOW after a second delay. With the left read line 340 being LOW and the right read line 350 being HIGH, the global read circuit 364 outputs a HIGH value after a third delay. This turns on the global select circuit 366, pulling the global read line 362 LOW after a fourth delay. With the global read line 362 LOW, the read out line 390 is HIGH. Because the read out line 390 is HIGH when a LOW value is read from memory, some implementations include an inverter (not shown) to match the output with the read value.

Now suppose with the same initial conditions, it is desired again to read "column a" of memory cells (110aa-110an) coupled with first read stage 320a, but the value is HIGH (e.g., logical 1). The value at the respective read input line 115a is HIGH, causing the read circuit 322a to output a LOW value, thereby turning off the bottom half of the select circuit 324a. The line_select signal 304a is toggled to HIGH, thereby turning on the other half of the select circuit 324a, though the left read line 340 is substantially unaffected and remains at its recovered HIGH value. With the left read line 340 and the right read line 350 both being HIGH, the global read circuit 364 outputs a LOW value. This turns off the global select circuit 366, maintaining the global read line 362 at the recovered HIGH value. With the global read line 362 HIGH (and the global reset signal 395 set to HIGH), the read out line 390 is LOW. The read out line 390 is LOW when a HIGH value is read from memory.

As illustrated by the above, reading out the memory can include five delays (i.e., a delay from each of the read circuit 322 and select circuit 324 of the first read stage 320, a delay from each of the global read circuit 364 and global select circuit 366 of the second read stage 360, and a delay from the third read stage 380). Further, the read circuits 322 of the first read stages 320 toggle, even when not selected, which can consume additional power. Even further, architectures can rely on separate recovery circuits and signals to ensure proper read out of the memory.

Figure 4A:
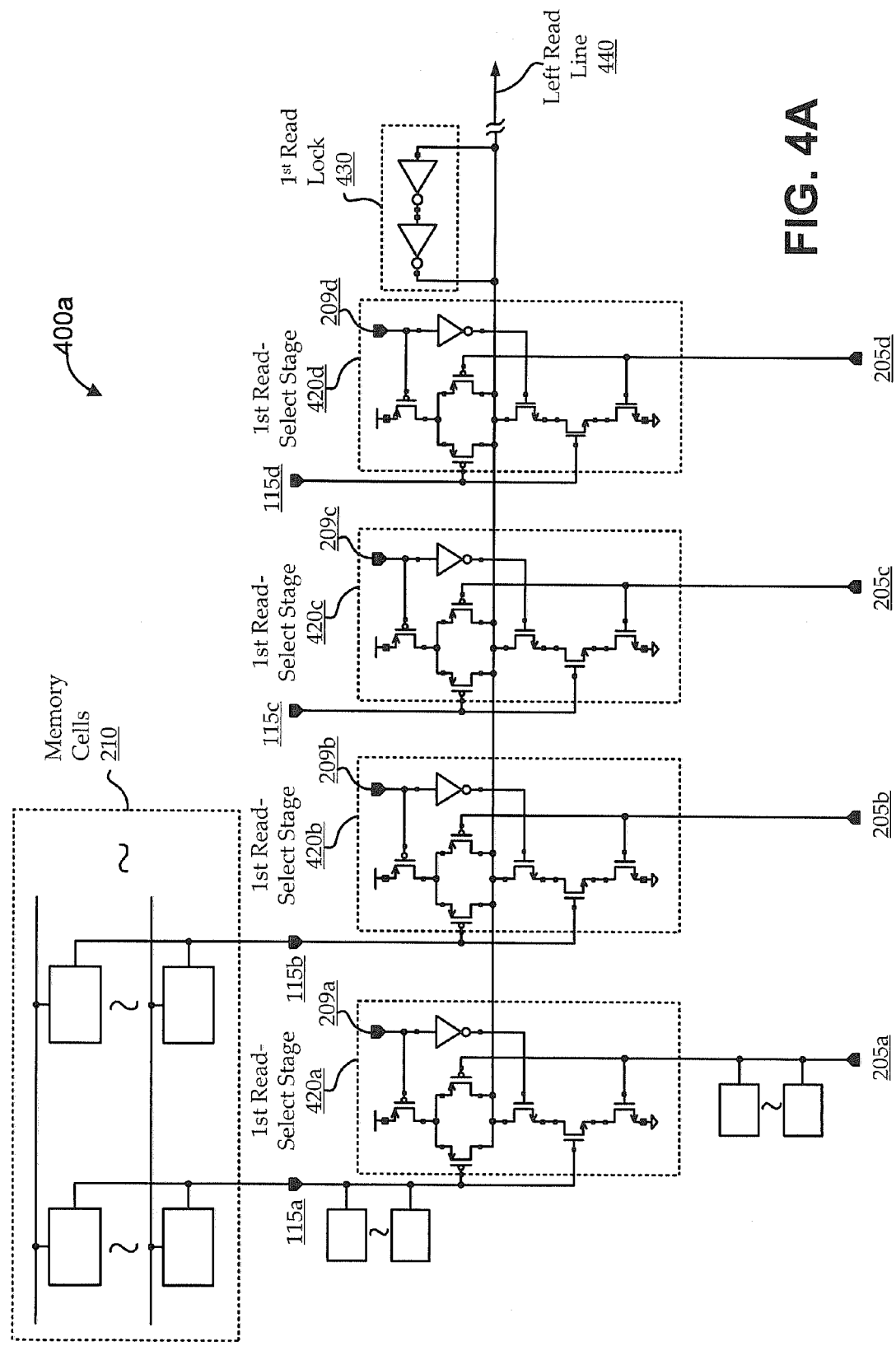
FIGS. 4A and 4B show schematic diagrams of a first and second part of an illustrative, novel memory read-out environment, respectively, according to various embodiments.
Figure 4B:
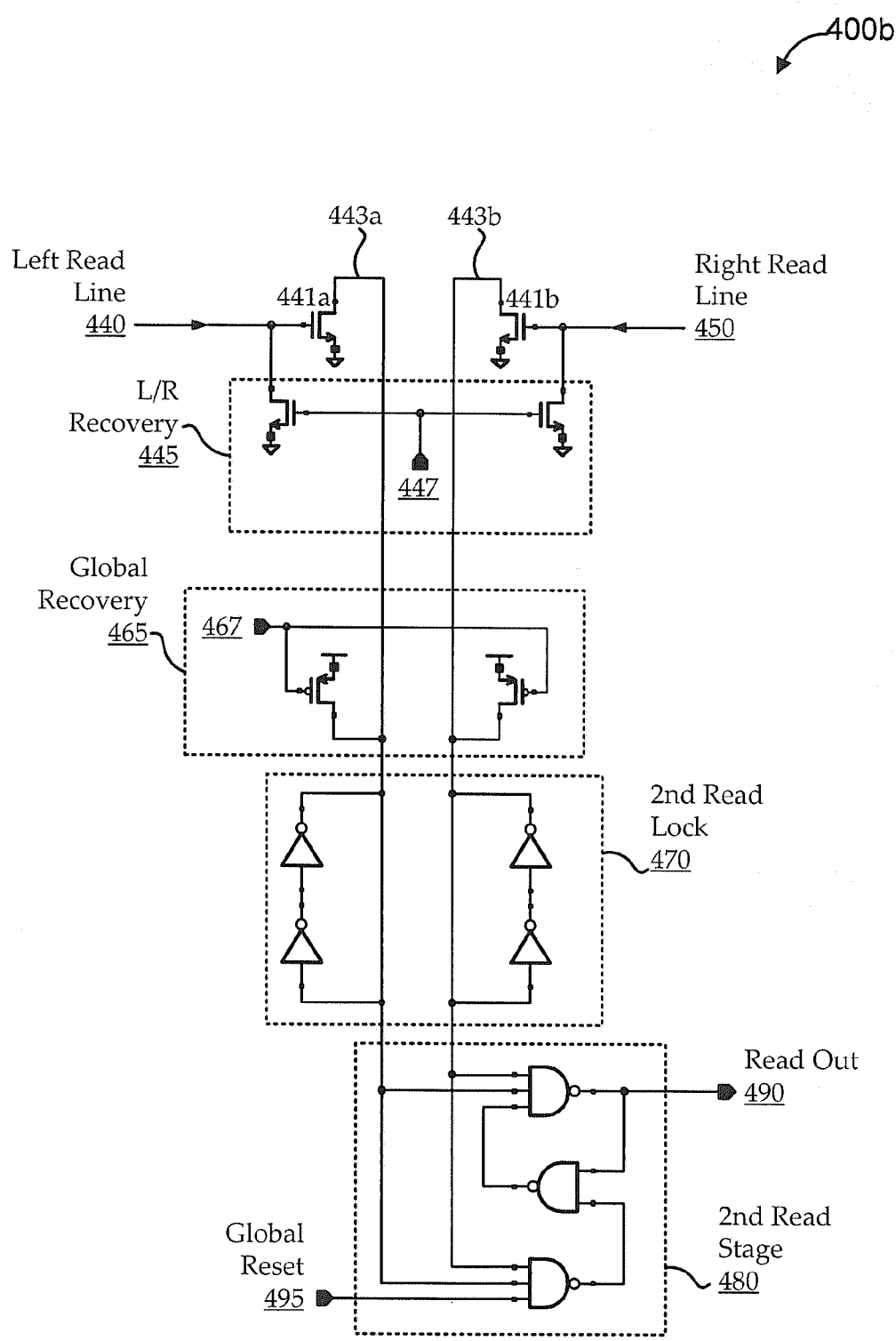

FIGS. 4A and 4B show schematic diagrams of a first and second part of an illustrative, novel memory read-out environment 400, respectively, according to various embodiments. In FIG. 4A, a memory array 105 of memory cells 110 is coupled to a memory read-out circuit. For example, each column of the memory array 105 is coupled with a respective first read stage 420. It is assumed (e.g., as described above with reference to FIG. 1B) that the illustrated memory array 105 is actually a left-hand sub-array, and, though not shown for the sake of simplicity, a substantially identical right-hand sub-array is coupled with substantially identical first read stages 420.

Each first read stage 420 includes a line read-select circuit, for example, the line read-select circuit 130 described above with reference to FIGS. 2A and 2B. As described above, the line read-select circuits 130 can be implemented with various features, including, for example, manifesting one delay (as compared to the two delays manifested by traditional, separate read and select circuitry), and not toggling when not selected. When one of the line read-select circuits 130 is enabled (i.e., to concurrently read and sect its respective column value), the read and selected value is reflected on a left read line 440 (i.e., and substantially identical functionality can causes a value to read, selected, and reflected on a right read line 450, shown in FIG. 4B). A first read lock circuit 430 can be included, for example, to prevent the left read line 440 from floating.

Turning to FIG. 4B, the left read line 440 and right read line 450 are coupled with a multi-global-line architecture 443 that directly feeds a final, second read stage 480 (e.g., without going through an intermediate global read stage, as illustrated by the second read stage 360 of FIG. 3B). The second read stage 480 outputs a read out line 490. For example, the multi-global-line architecture 443 includes multiple (e.g., two) global read lines that feed a set of gates arranged as a staticizer circuit or the like. The second read stage 480 can add a delay. Some implementations also include a second read lock circuit 470, for example, to maintain the global line values, even though no global read stage is included. Some implementations also include a left-right recovery circuit 445 and a global recovery circuit 465. In some implementations, the left-right recovery circuit 445 is removed, and read select inputs for each first read stage 420 (e.g., read_select inputs 209 of FIGS. 2A and 2B) are used in lieu of separate left-right recovery signaling.

For the sake of illustration, the signals are initially configured so that all the first read stage 420 circuits are disabled and controlled only by their respective read input lines 115 (or read_top inputs 203, as illustrated in FIGS. 2A and 2B) and their respective read_select inputs 209. As discussed above, for the particular implementation of line read-select circuit illustrated, this can be accomplished by setting all the read_bottom inputs 205 and the read_select inputs 209 to a logical HIGH value. It is assumed as a starting condition that the left read line 440 and the right rad line 450 are LOW. For example, in some embodiments, a left-right recovery signal 447 can go HIGH, causing the left-right recovery circuit 445 to pull both the left read line 440 and the right read line 450 LOW. The left-right recovery signal 447 can return to LOW, effectively turning the left-right recovery circuit 445 off, and allowing the values on the left read line 440 and the right read line 450 to be controlled by their respective first read stages 420 (e.g., and/or maintained by the respective first read lock circuits 430). Similarly, a global recovery signal 467 can go LOW, causing the global recovery circuit 465 to turn on and pull the two global read lines 443 HIGH. The global recovery signal 467 can return to HIGH, effectively turning the global recovery circuit 465 off, and allowing the value on both global read lines 443 to be controlled by outputs of the first read stages 420 (e.g., and/or maintained by the second read lock circuit 470). A global reset signal 495 is also set to HIGH.

Suppose it is desired to read "column a" of memory cells (110aa-110an) coupled with first read stage 420a, and the value is LOW (e.g., logical 0). The value at the respective read input line 115a is LOW. When the read_select input 209a goes LOW, the line read-select circuit outputs a HIGH value (e.g., see FIG. 2A) to the left read line 440 after a first delay. When the left read line 440 goes HIGH, a left global line switch 441a turns on, thereby pulling the left global read line 443a LOW after a second delay. With the left global read line 443a LOW, the read out line 490 is HIGH (e.g., after a third delay). Because the read out line 490 is HIGH when a LOW value is read from memory, some implementations include an inverter (not shown) to match the output with the read value.

Now suppose with the same initial conditions, it is desired again to read "column a" of memory cells (110aa-110an) coupled with first read stage 420a, but the value is HIGH (e.g., logical 1). The value at the respective read input line 115a is HIGH. When the read_select input 209a goes LOW, the line read-select circuit outputs a LOW value (e.g., see FIG. 2B) to the left read line 440. As described above, regardless of whether separate recovery signaling is used, the left read line 440 is typically already LOW. Accordingly, when the read_select input 209a goes LOW, the line read-select circuit can be considered as merely maintaining the LOW value on the left read line 440. This can also keep the left global line switch 441a off, thereby maintaining the left global read line 443a in its initial HIGH state. With the left global read line 443a HIGH (and the right global read line 443b HIGH, and the global reset signal 495 HIGH), the read out line 490 is LOW. The read out line 490 is LOW when a HIGH value is read from memory.

As illustrated by the above, reading out the memory can be implemented in only three delays (i.e., a single delay from the first read stage 420, a single delay from the global line switches 441, and a delay from the second (final) read stage 480). This can reduce delays associated with memory readout over some traditional implementations. Further, the line read-select circuits of the first read stages 420 do not toggle unless they are selected, which can reduce power consumption over some traditional implementations. Even further, as described above, the read_select inputs 209 can be used for recovery signaling in lieu of separate recovery circuits in some implementations.

Figure 5:
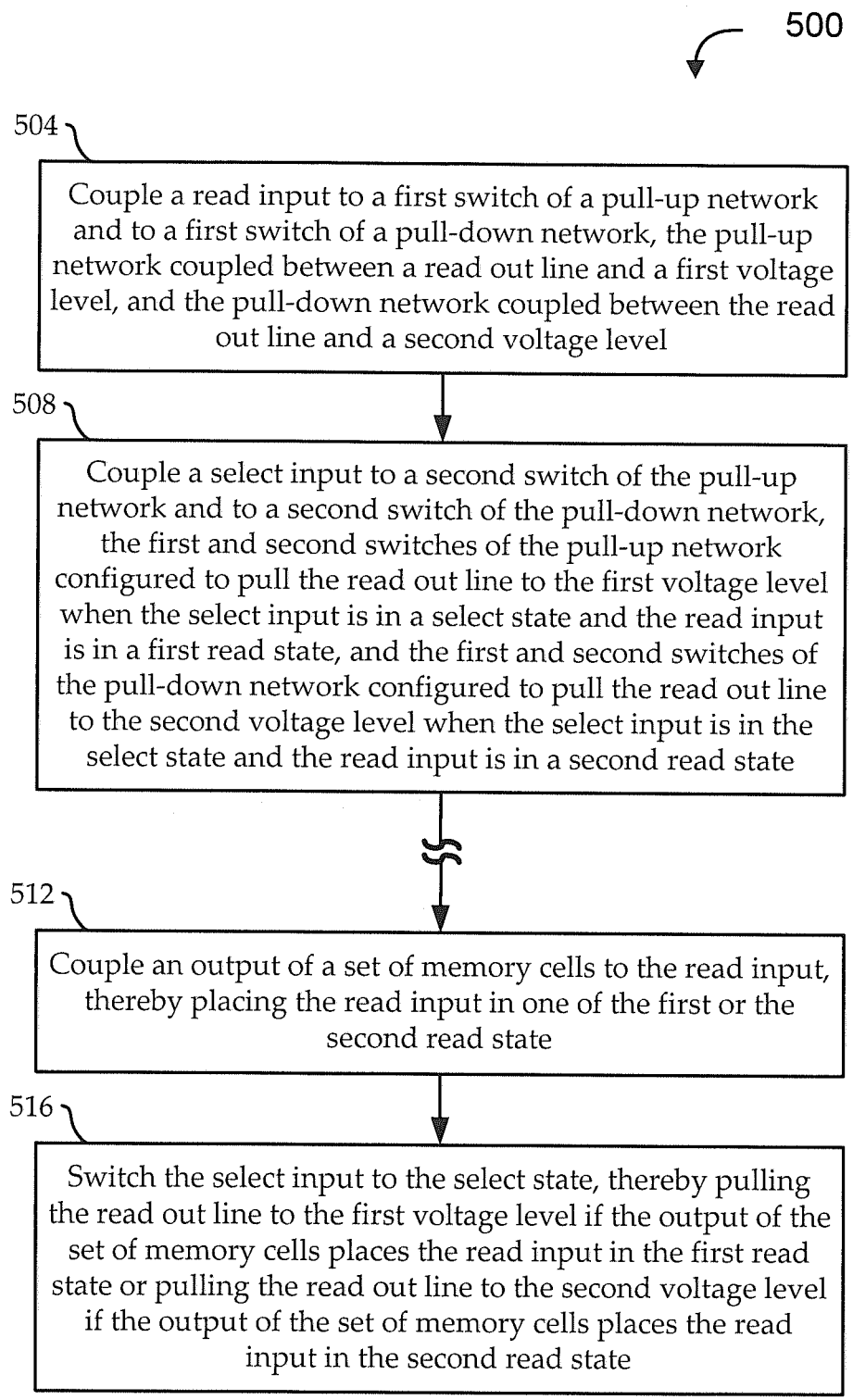
FIG. 5 shows a flow diagram of an illustrative method for memory read-out, according to various embodiments.

Turning to FIG. 5, a flow diagram is provided of an illustrative method 500 for memory read-out, according to various embodiments. Embodiments of the method 500 begin at stage 504 by coupling a read input to a first switch of a pull-up network and to a first switch of a pull-down network. The pull-up network is coupled between a read-out line and a first voltage level, and the pulldown network is coupled between the read-out line and a second voltage level. For example, the pull-up network is a network of PMOS transistors coupled between the read-out line and a logical HIGH voltage level (e.g., +5 Volts), and the pull-down network is a network of NMOS transistors coupled between the read-out line and a logical LOW level (e.g., ground).

At stage 508, a select input is coupled to a second switch of the pull-up network and to a second switch of the pull-down network. The first and second switches of the pull-up network are configured to pull the read-out line to the first voltage level when the select input is in a select state and the read input is in a first read state. For example, the pull-up network can be configured to pull the read-out line to a logical HIGH level when the select input goes LOW and the read input is LOW. The first and second switches of the pull-down network are configured to pull the read-out line to the second voltage level when the select input is in the select state and the read input is in a second read state. For example, the pull-down network can be configured to pull the read-out line to a logical LOW level when the select input goes LOW and the read input is HIGH.

According to some embodiments, further connections are made so that the functionality described with reference to stages 504 and 508 can be used to set the value of the read-out line according to an output value from one or more memory cells. At stage 512, an output of a set of memory cells is coupled to the read input, thereby placing the read input in one of the first or the second read state. For example, in an array of memory cells, a set (e.g., row or column) of memory cells can be coupled to the read input, and the output value of the set of memory cells can reflect a present value of a selected memory cell from the set. If the output value of the set of memory cells is HIGH, the read input can be similarly HIGH according to the coupling therebetween.

At stage 516, the select input can be switched to its select state (e.g., LOW), thereby pulling the read-out line up or down according to the value of the output of the set of memory cells as reflected on the read input. In some implementations, the read-out line is pulled to the first voltage level if the output of the set of memory cells places the read input in the first read state, or the read-out line is pulled to the second voltage level if the output of the set of memory cells places the read input in the second read state. For example, if the output of the set of memory cells is LOW when the select input switches to its select state, the values of the read input and the select input turn on the pull-up network and turn off the pull-down network, thereby pulling the read-out line up to the first voltage level. Alternately, if the output of the set of memory cells is HIGH when the select input switches to its select state, the values of the read input and the select input turn off the pull-up network and turn on the pull-down network, thereby pulling the read-out line down to the second voltage level.

Figure 6A:
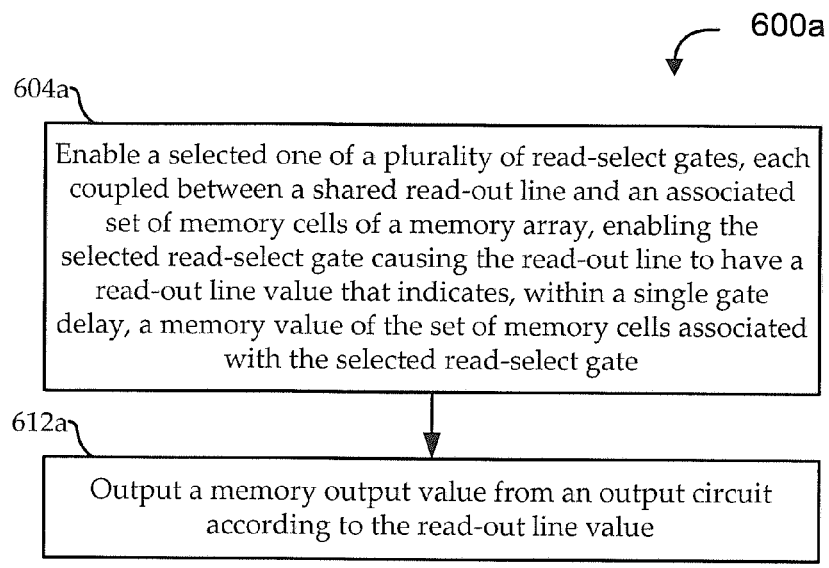
FIG. 6A shows a flow diagram of another illustrative method for memory read-out, according to various embodiments.

FIG. 6A shows a flow diagram of another illustrative method 600*a* for memory read-out, according to various embodiments. Embodiments of the method 600*a* begin at stage 604*a* by enabling a selected one of a number of read-select gates. Each read-select gate is coupled between a shared read-out line and an associated set of memory cells of a memory array. Enabling the selected read-select gate causes the read-out line to have a read-out line value that indicates a memory value of the set of memory cells associated with the selected read-select gate. As described above, rather than having separate read and select gates, each with its own associated gate delay, embodiments include a combined read-select gate that operates within a single gate delay.

In some implementations, the read-select gate operates according to the method 500 described with respect to FIG. 5. For example, the read-select gate is coupled between the shared read-out line and the associated set of memory cells via its read input. Enabling the selected read-select gate can involve using addressing functionality to select the desired read-select gate from the number of read-select gates, and switching the select input of that gate to its select state. Enabling the selected read-select gate can effectively cause the memory value of the set of memory cells associated with the selected read-select gate to concurrently be read and selected for output on the shared read-out line.

In some embodiments, the read-select gates are coupled via the shared read-out line to an output circuit. At stage 612*a*, the output circuit is used to output a memory output value according to the read-out line value. In some implementations, the output circuit includes one or more gates (e.g., arranged as a staticizer, or the like) configured to generate the memory output value as a function of the value present on the shared read-out line.

Figure 6B:
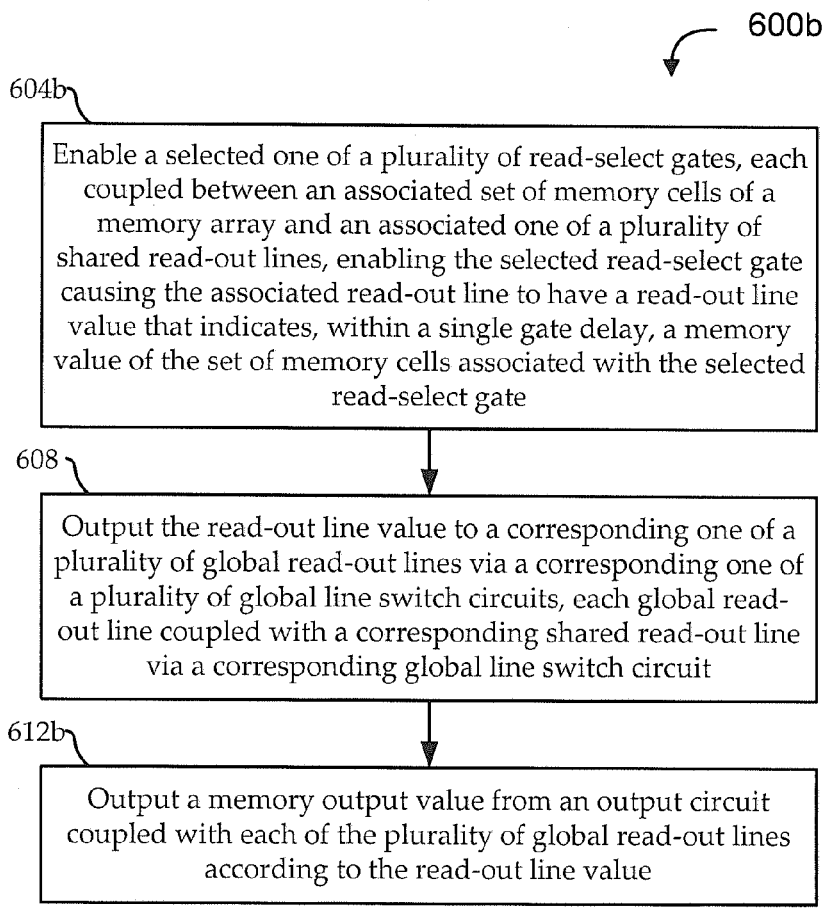
FIG. 6B shows a flow diagram of another illustrative method for memory read-out that is an alternative embodiment of the method of FIG. 6A.

FIG. 6B shows a flow diagram of another illustrative method 600*b* for memory read-out that is an alternative embodiment of the method 600*a* of FIG. 6A. Embodiments of the method 600*b* begin at stage 604*b* by enabling a selected one of a number of read-select gates having an output that is coupled between an associated set of memory cells of a memory array and one of a number of shared read-out lines. Enabling the selected read-select gate causes its associated shared read-out line to have a read-out line value that indicates a memory value of the set of memory cells associated with the selected read-select gate. For example, in a wide memory array having many (e.g., eight or more) columns of memory cells, subsets of columns (e.g., four-column subsets) are tied, each via respective read-select gates, to respective shared read-out lines.

At stage 608, the read-out line value on the shared read-out line is output to one of a number of global read-out lines via a corresponding one of a number of global line switch circuits. Certain embodiments described herein can be implemented with a single global read-out line. However, according to stage 608, some implementations have multiple global read-out lines, each coupled with a respective shared read-out line via a respective global line switch. For example, a wide memory array includes eight columns of memory cells. Each column is coupled in parallel with a respective read-select gate, so that there are eight read-select gates. The outputs of four of the read-select gates are coupled with a first shared read-out line, and the outputs of the other four of the read-select gates are coupled with a second shared read-out line. The first shared read-out line is coupled with a first global read-out line via a first global line switch, and the second shared read-out line is coupled with a second global read-out line via a second global line switch.

Each global read-out line can then be coupled with an output circuit. At stage 612b, the output circuit is used to output a memory output value according to the read-out line value. For example, the output circuit includes one or more gates coupled with all the global read-out lines, and operable to generate the memory output value as a function of the values present on all the global read-out lines. Implementations are configured so that only the relevant read-out line value controls the memory output value, though all the global memory lines are coupled with the output circuit. For example, the values of all the global read-out lines are always LOW, unless the memory value of the set of memory cells associated with the selected read-select gate is HIGH, in which case the global read-out line associated with the shared read-out line associated with the selected read-select gate goes HIGH.

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims.

The various operations of methods and functions of certain system components described above may be performed by any suitable means capable of performing the corresponding functions. The means may include various hardware and/or software component(s) and/or module(s), including, but not limited to a circuit, an application specific integrated circuit (ASIC), or processor. For example, logical blocks, modules, and circuits described may be implemented or performed with a general purpose processor, a digital signal processor (DSP), an ASIC, a field programmable gate array signal (FPGA), or other programmable logic device (PLD), discrete gate, or transistor logic, discrete hardware components, or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm or other functionality described in connection with the present disclosure, may be embodied directly in hardware, in a software module executed by a processor, or in a combination of the two. A software module may reside in any form of tangible storage medium. Some examples of storage media that may be used include random access memory (RAM), read only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media. Thus, a computer program product may perform operations presented herein. For example, such a computer program product may be a computer readable tangible medium having instructions tangibly stored (and/or encoded) thereon, the instructions being executable by one or more processors to perform the operations described herein. The computer program product may include packaging material. Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:
1. A system comprising:
   a read-select circuit comprising:
   a read input;
   a select input;
   a first voltage level input and a second voltage level input;
   a read-select output;
   a first switch network coupled between the read-select output and the first voltage level input, the first switch network comprising a first switch coupled with the read input and a second switch coupled with the select input, the first switch network operable to pull the read-select output to the first voltage level input when the read input is in a first read state and the select input is in a select state; and
   a second switch network coupled between the read-select output and the second voltage level input, the second switch network comprising a third switch coupled with the read input and a fourth switch coupled with the select input, the second switch network operable to pull the read-select output to the second voltage level input when the read input is in a second read state and the select input is in the select state, such that a memory state of a memory cell coupled with the read input is concurrently read and selected according to respective states of the read input and the select input.

2. The system of claim 1, wherein:
the first switch network is a pull-up network;
the second switch network is a pull-down network; and
the first, second, third, and fourth switches are transistors.

3. The system of claim 1, wherein:
the first switch network is operable, when the read input is in the first read state, to pull the read-select output to the first voltage level input within a single gate delay after the select input is switched to the select state; and
the second switch network is operable, when the read input is in the second read state, to pull the read-select output to the second voltage level input within a single gate delay after the select input is switched to the select state.

4. The system of claim 1, further comprising:
an array of memory cells, a subset of the memory cells coupled with a memory subset output that is coupled with the read input of the read-select circuit so that the read input is in the first read state when the memory subset output indicates a first memory state, and the read input is in the second read state when the memory subset output indicates a second memory state.

5. The system of claim 1, further comprising:
a plurality of read-select circuits, the read-select circuit being one of the plurality of read-select circuits; and
a plurality of subsets of memory cells of a memory, each coupled with an associated memory subset output that is coupled with a read input of an associated one of the plurality of read-select circuits, so that the read input of each read-select circuit is in the first read state when its associated memory subset output indicates a first memory state, and the read input of each read-select circuit is in the second read state when its associated memory subset output indicates a second memory state.

6. The system of claim 5, further comprising:
a shared read-out line coupled with the read-select outputs of the plurality of read-select circuits,
wherein the select inputs of the plurality of read-select circuits are normally not in the select state, such that, when the select input of a particular read-select circuit is switched to the select state, the shared read-out line indicates a value according to the memory state of the subset of memory cells associated with the particular read-select circuit.

7. The system of claim 6, further comprising:
a memory output circuit coupled with the shared read-out line and operable to generate a memory output value according to the value indicated by the shared read-out line.

8. The system of claim 7, wherein the memory output circuit is a staticizer circuit.

9. The system of claim 5, further comprising:
a first shared read-out line coupled with the read-select outputs of a first portion of the plurality of read-select circuits; and
a second shared read-out line coupled with the read-select outputs of a second portion of the plurality of read-select circuits,
wherein the select inputs of the plurality of read-select circuits are normally not in the select state, such that, when the select input of a particular read-select circuit is switched to the select state, the shared read-out line coupled with the read-select output of the particular read-select circuit indicates a value according to the memory state of the subset of memory cells associated with the particular read-select circuit.

10. The system of claim 9, further comprising:
a memory output circuit coupled with the first and second shared read-out lines and operable to generate a memory output value according to the value indicated by the shared read-out line coupled with the read-select output of the particular read-select circuit.

11. The system of claim 10, further comprising:
a multi-global-line circuit comprising:
a first global read-out line coupled with the first shared read-out line via a first global line switch; and
a second global read-out line coupled with the second shared read-out line via a second global line switch,
wherein each of the first and second global line switches is operable to indicate a global read-out value on its respective global read-out line according to the value indicated by its respective shared read-out line, and
wherein the memory output circuit is coupled with the first and second shared read-out lines via the multi-global-line circuit and is operable to generate the memory output value according to the global read-out values of the first and second global read-out lines.

12. The system of claim 5, further comprising:
a controller configured to enable one of the plurality of read-select circuits by setting its select input to the select state.

13. A method for memory read-out, the method comprising:
coupling a read input to a first switch of a first switch network and to a first switch of a second switch network, the first switch network coupled between a read-select output and a first voltage level, and the second switch network coupled between the read-select output and a second voltage level;
coupling a select input to a second switch of the first switch network and to a second switch of the second switch network, the first and second switches of the first switch network configured to pull the read-select output to the first voltage level when the select input is in a select state and the read input is in a first read state, and the first and second switches of the second switch network configured to pull the read-select output to the second voltage level when the select input is in the select state and the read input is in a second read state; and
switching the select input to the select state when the read input is in the first read state, thereby pulling the read-select output to the first voltage level, thereby concurrently reading and selecting a memory state of a memory cell coupled with the read input according to respective states of the read input and the select input.

14. The method of claim 13, further comprising:
coupling an output of a set of memory cells to the read input, thereby placing the read input in one of the first or the second read state according to the output of the set of memory cells.

15. The method of claim 13, wherein:
switching the select input to the select state when the read input is in the first read state thereby pulls the read-select output to the first voltage level within a single gate delay after the select input is switched to the select state.

16. The method of claim 13, further comprising:
coupling the read-select output with a shared read-out line,
wherein the first switch network, the second switch network, and the read-select output are part of a particular read-select circuit of a plurality of read-select circuits, each read-select circuit having a select input and having a read-select output that is coupled with the shared read-out line, and wherein the select inputs of the plurality of read-select circuits are normally not in the select state, such that switching the select input of the particular read-select circuit to the select state when the read input is in the first read state thereby pulls the shared read-out line to a value according to pulling the read-select output of the particular read-select circuit to the first voltage level.

17. The method of claim 16, further comprising:
generating a memory output value according to the value indicated by the shared read-out line.

18. The method of claim 13, further comprising:
coupling the read-select output with a first of a plurality of shared read-out lines,
wherein the first switch network, the second switch network, and the read-select output are part of a particular read-select circuit of a plurality of read-select circuits, each read-select circuit having a select input and a read-select output, the read-select outputs of a first portion of the read-select circuits coupled with the first shared read-out line and the read-select outputs of a second portion of the read-select circuits coupled with the second shared read-out line, and
wherein the select inputs of the plurality of read-select circuits are normally not in the select state, such that switching the select input of the particular read-select circuit to the select state when the read input is in the first read state thereby pulls the first shared read-out line to a value according to pulling the read-select output of the particular read-select circuit to the first voltage level.

19. The method of claim 18, further comprising:
generating a memory output value according to the values indicated by both the first and second shared read-out lines, thereby generating the memory output value according to pulling the read-select output of the particular read-select circuit to the first voltage level.

20. The method of claim 18, further comprising:
coupling a first global read-out line with the first shared read-out line via a first global line switch;
coupling a second global read-out line with the second shared read-out line via a second global line switch, such that each of the first and second global read-out lines indicates a global read-out value according to the value indicated by its respective shared read-out line; and
generating a memory output value according to the values indicated by both the first and second global read-out lines, thereby generating the memory output value according to pulling the read-select output of the particular read-select circuit to the first voltage level.

21. A system comprising:
a plurality of read-select circuits, each comprising:
a first switch network that pulls a respective read-select output to a first voltage level when a respective read input is in a first read state and a respective select input is in a select state, each respective select input being normally not in the select state; and
a second switch network that pulls the respective read-select output to a second voltage level when the respective read input is in a second read state and the respective select input is in the select state;
a plurality of subsets of memory cells of a memory, each coupled with an associated memory subset output that is coupled with a read input of an associated one of the plurality of read-select circuits, so that the read input of each read-select circuit is in the first read state when its associated memory subset output indicates a first memory state, and the read input of each read-select circuit is in the second read state when its associated memory subset output indicates a second memory state;
a plurality of shared read-out lines, each coupled with the read-select outputs of a respective portion of the plurality of read-select circuits, such that, when the select input of a particular read-select circuit is switched to the select state, the shared read-out line coupled with the read-select output of the particular read-select circuit indicates a value according to the memory state of the subset of memory cells associated with the particular read-select circuit; and
a multi-global-line circuit comprising:
a plurality of global read-out lines, each coupled with a respective shared read-out line via a respective global line switch, and each operable to indicate a global read-out value on its respective global read-out line according to the value indicated by its respective shared read-out line.

22. The system of claim 21, further comprising:
a memory output circuit coupled with the plurality of shared read-out lines via the multi-global-line circuit and operable to generate a memory output value according to the value indicated by the shared read-out line coupled with the read-select output of the particular read-select circuit according to the global read-out values of the global read-out lines.

* * * * *